FOUR REGION SWITCHING TRANSISTOR FOR RELATIVELY LARGE CURRENTS

Filed March 30, 1961

WITNESSES:

Bernard R. Gieguez

James F. Young

INVENTORS
David L. Moore and
Toshihiko Suzuki.
BY F. H. Cleary
ATTORNEY

United States Patent Office 3,218,525

Patented Nov. 16, 1965

3,218,525

FOUR REGION SWITCHING TRANSISTOR FOR RELATIVELY LARGE CURRENTS

David L. Moore, Jeannette, and Toshihiko Suzuki, Greensburg, Pa., assignors to Westinghouse Electric Corporation, East Pittsburgh, Pa., a corporation of Pennsylvania Filed Mar. 30, 1961, Ser. No. 99,556
2 Claims. (Cl. 317—235)

This invention relates to a semiconductor switch and method for producing the semiconductor switch.

In conventional four region three terminal semiconductor switching devices, the cathode and the gate are alloyed to the same diffused region. When producing these devices the cathode and gate alloys frequently flow together resulting in an inoperative or defective device. Also due to the close proximity of the gate and the cathode it was not practical to attach a heat sink of any substantial size to the cathode. Heat sinks are required to efficiently dissipate the heat resulting from neutralization, to enable the semiconductor to carry a maximum amount of current. However, in conventional switches heat sinks are placed only on one side of the device since the other side of the device contains on its surface the closely spaced gate and the cathode connections which are of opposite conductivity type. In addition, the gate and cathode connections are necessarily relatively small so that even if a heat sink were applied to one or the other it would only be able to cover a relatively small amount of area for heat dissipation.

Therefore, an object of the invention is to provide a semiconductor switch having a relatively large current carrying capacity.

A further object of the invention is the provision of a process for producing four region, three terminal semiconductor switches with a minimum number of rejects or defective semiconductors.

Another object of the invention is to provide a process for producing a four region, three terminal semiconductor switch which requires no critical alignment of regions or elements.

Still another object of the invention is the provision of a four region, three terminal semiconductor switch which can handle relatively large amounts of current for the size of the switch, without damage to the semiconductor.

Still another object of the invention is to provide a four layer, three terminal semiconductor switch having a minimum thermal impedance from element to heat sink for a given size element or device.

Other objects of the invention will, in part, appear obvious and will, in part, appear hereinafter. For a better understanding of the nature and the objects of the present invention, reference should be made to the following detailed description and drawings, in which.

The invention relates broadly to an improvement in a four layer or four region semiconductor switch such as a p-n-p-n or an n-p-n-p type. A four layer or four region semiconductor switch, having three terminals, an anode terminal, a cathode terminal, and a gate terminal effectively operates as two transistors of opposite conductivity type.

Figure 1:
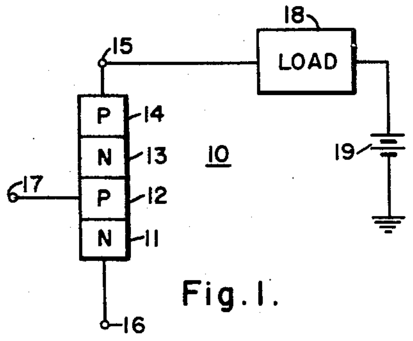
FIGURE 1 illustrates a block diagram of a four layer, three terminal switch.
Figure 2:
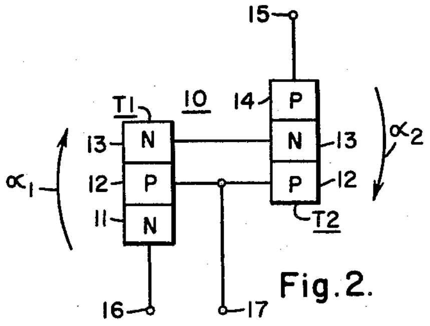
FIG. 2 illustrates a block diagram of the equivalent circuit of a semiconductor switch illustrated in FIG. 1.

An example of such a four layer, three terminal device is illustrated in FIGURE 1 which is a schematic diagram of the p-n-p-n three terminal device illustrated as numeral 10 in FIGURE 1. This device comprises a first outer region 11 forming an n-type region, a first inner region 12 formed of a p-type conductivity material, a second inner region 13 of an n-type material and a second outer region 14 of a p-type conductivity material. The semiconductor switch has an anode terminal 15, a cathode terminal 16 and a gate terminal 17 which is connected to the first inner base region 12. The equivalent diagram of this four layer or four region device is shown schematically in FIGURE 2 which effectively operates as two complementary transistors, T1 being an n-p-n type consisting of regions 11, 12 and 13 and T2 a p-n-p type. FIGURE 1 shows the four region device connected in series with the load 18 in a direct current voltage source 19. By applying a positive voltage of sufficient magnitude to the gate terminal 17, a semiconductor switch will be rendered conductive. As shown in FIGURE 2, the equivalent of this circuit is the two end transistors, T1 which is an n-p-n type and T2 which is a p-n-p type. When the current applied between the gate terminal 17 and the cathode terminal 16 is sufficiently positive to increase the $\alpha_1$ of the n-p-n transistor, the $\alpha_1$ of T1 plus $\alpha_2$ of T2 will be greater than one and the device will be rendered conductive.

As shown in FIGURE 2 the second inner region or electrode 13 operates as both the collector for the equivalent transistor T1 and also functions as the base electrode for the equivalent transistor T2. Additionally, the first inner region 12 operates as a base electrode for the equivalent transistor T1 and as the collector electrode for the equivalent transistor T2. $\alpha_1$ illustrated in FIGURE 2 is the current amplification factor of the current between the emitter and collector of the equivalent transistor T1 whereas $\alpha_2$ is the current amplification factor between the emitter and collector of the equivalent transistor T2. When the current applied between the gate terminal 17 and the emitter or cathode terminal 16 is sufficiently positive the device will be rendered conductive by increasing $\alpha_1$ so that $\alpha_1$ plus $\alpha_2$ is greater than one.

In conventional four layer, or four region three terminal semiconductor switches, the cathode and gate connections, of opposite conductivity type, are alloyed to a diffused region on the semiconductor body. Consequently, this side of the semiconductor device presents a problem in applying a heat sink of any substantial size to dissipate the heat. In addition, these conventional devices were formed by diffusing a body of material of either germanium and silicon with an opposite conductivity type impurity. One side of this material was grooved or else the edges were sheared off so as to then provide a three layer structure. On one side of the body the anode connection was made, and on the other side the cathode and gate connections were made. This requires care in fabrication to prevent shorts (alloys flowing together). For small units having a structure in which the cathode surrounds the gate, the cathode ring becomes very narrow and it is difficult to attach the lead wire with sufficient current carrying capacity thereto. This is also true when the gate is spaced from the cathode and the gate is a relatively small region so that it is difficult to attach thereto a lead wire having any substantial amount of current carrying capacity.

Figures 3, 4:
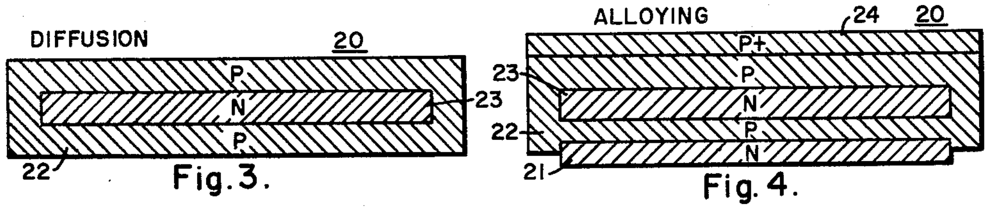
FIGS. 3 through 5 illustrate further cross sections illustrating the process of making a four layer, three terminal device in accordance with the invention.
Figures 5, 7:
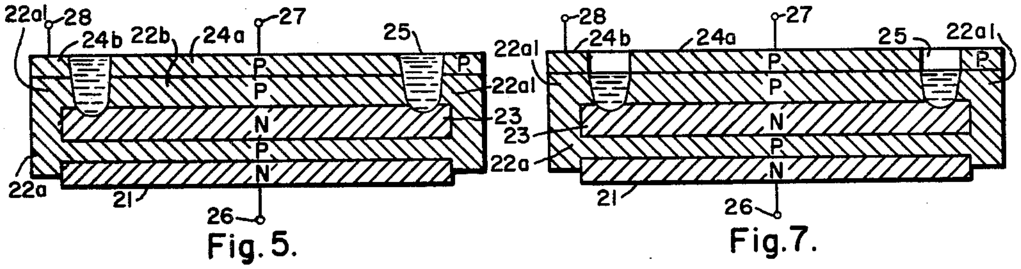
FIG. 7 illustrates a cross-sectional view of an embodiment of the invention helpful in explaining the invention.

In the embodiment of the invention illustrated in FIGS. 3 through 5, a body of n-type material such as silicon, 23, is diffused with a p-type material such as aluminum, boron, and gallium, 22 at a temperature of about 1000° C. to 1300° C. This results in a structure illustrated in FIG. 3, with the n-type silicon forming one region and an outer layer surrounding this silicon disc forming a p-region.

After the n- and p-regions are formed by diffusion as shown in FIG. 3, this structure is placed into the fusion boat with a p-type anode disc 24 being placed on one side of the body and an n-type cathode disc 21 being placed on the other side of the body. With these three elements, the diffused silicon wafer, the anode disc 24 and the cathode n-type disc 21 are then alloyed. After the p-type disc 24 and the n-type cathode disc 21 are alloyed to the diffused silicon wafer, they will have the general appearance as shown in the cross section in view of FIG. 4.

Figure 6:
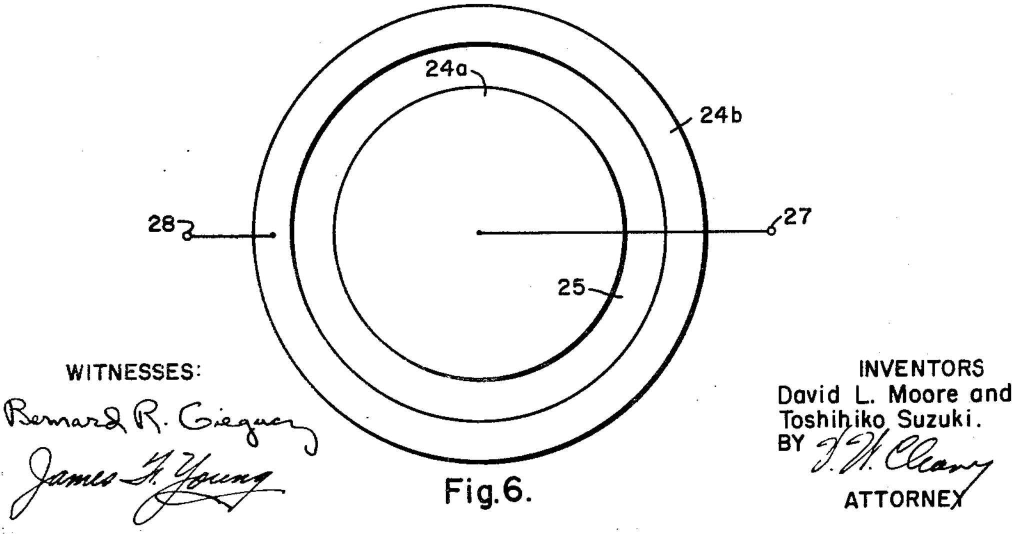
FIG. 6 illustrates a plan view of the embodiment of the invention illustrated in FIG. 5.

After the alloying step described above, a circular enclosed loop groove 25 is scribed and etched in the anode side of the semiconductor body shown in FIG. 4. This groove extends through the disc 24, one side of the p-region 22 and into the n-type silicon 23. It will be understood that the contact between the disc 24 and the p-region 22 is a non-rectifying ohmic contact whereas the alloyed connection between the cathode disc 21 and the p-region 22 would be a rectifying contact. By etching the groove 25 shown in FIGS. 5 and 6, the disc 24 is divided into an outer gate ring **24*b* and an inner circular disc 24*a*. Additionally, this groove divides the p layer 22 into a lower portion 22*a* which extends across one side of the n-region 23 and having up turned ends 22*al* which extend upwardly around the edges of the n layer 23 across the other side of the n-region 23 with this region 22*a* being terminated by or defined by the groove 25. The groove 25 also thereby defines an outer p-region 22*b* which is circular in shape and separate and distinct from the lower p-region 22*a*. A cathode terminal 26 is ohmically connected to the n-type cathode disc 21 whereas the anode terminal 27 is ohmically connected to the anode disc 24*a*. The gate terminal 28 is connected ohmically to the outer gate ring 24*b***.

By providing a gate ring on the outer portion of the groove 25, connections to the ring **24*b* are easier and less critical to make and the anode disc 24*a* provides a relatively large area with which to attach a heat sink. Additionally, the cathode disc 21 also provides a relatively large area in which to attach a heat sink to dissipate the heat generated by passage of heavy currents through the device between the anode and cathode connections 27 and 26**. This structure is produced by the three relatively simple steps illustrated in FIGS. 3 through 5.

The groove 25 illustrated in FIG. 5 is formed by masking the disc 24 shown in FIG. 4 with wax, scribing the desired width and placement of the groove and etching through the alloy with a suitable acid. If it is desired to make the groove 25 so as to alleviate any difficulty in etching through the gold silicon alloy and the diffused layer, separate rings, namely the gate ring **24*b* and the anode disc 24*a* can be alloyed to the diffused silicon wafer shown in FIG. 3 so that in the step illustrated in FIG. 4, the ring 24*b* and disc 24*a* will be alloyed to the same side of the p-type region 22. If the alloying process is done in this manner, the etching required will only be through the p layer 22 and no waxing or scribing will be necessary. Such a device is illustrated in FIG. 7 with the groove 25 through the diffused layer 22 to form p-type regions 22*b* and 22*a***.

Although the invention has been described in connection with specific processes and semiconductor switches produced by such processes, it will be apparent to those skilled in the art that changes and modifications can be made to suit the requirements of a particular application without departing from the spirit and scope of the invention.

We claim as our invention:

1. A semiconductor switch comprising a monocrystalline semiconductor member having four consecutive regions of alternate p-type and n-type conductivity material to form a first outer region, a first inner region, a second inner region and a second outer region having rectifying functions therebetween, said first inner region having a first portion extending across a first major surface of said second inner region and a second portion extending around the edge of said second inner region, and comprising a peripheral portion on a second major surface of said second inner region, said peripheral portion being coplanar with said second outer region, a closed loop groove separating said second outer region and said peripheral portion of said first inner region, a first terminal means having an electrical contact with said first outer region, second terminal means having an electrical contact with said second outer region, and third terminal means having electrical contact with said peripheral portion of said first inner region.

2. A semiconductor switch device comprising four successive regions of semiconductive material of alternate semiconductivity type including, in sequence: a first outer region serving as a cathode, a first inner region, a second inner region and a second outer region serving as an anode; said first inner region having a portion extending around the edge of said second inner region to a position coplanar with said anode region and separated from said anode region by a closed loop groove; means making electrical contact to said cathode region, said anode region and said portion of said first inner region which is coplanar with said anode region.

References Cited by the Examiner

UNITED STATES PATENTS

| | | | |
|---|---|---|---|
| 2,794,846 | 6/1957 | Fuller | 317—235 |
| 2,980,830 | 4/1961 | Shockley | 317—235 |
| 3,040,218 | 6/1962 | Byczkowski | 317—234 |
| 3,097,335 | 7/1963 | Schmidt | 317—235 |

JOHN W. HUCKERT, *Primary Examiner.*

CHESTER L. JUSTUS, *Examiner.*